(12) United States Patent
Kim

(10) Patent No.: US 6,553,530 B1
(45) Date of Patent: Apr. 22, 2003

(54) INTEGRATED CIRCUIT DEVICES THAT INCLUDE SELF-TEST APPARATUS FOR TESTING A PLURALITY OF FUNCTIONAL BLOCKS AND METHODS OF TESTING SAME

(75) Inventor: Heon-cheol Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/366,252

(22) Filed: Aug. 3, 1999

(30) Foreign Application Priority Data

Aug. 13, 1998 (KR) ............................................. 98-32891

(51) Int. Cl.[7] .......................... G06F 11/00; G01R 31/28
(52) U.S. Cl. ....................... 714/738; 714/739; 714/732; 714/728
(58) Field of Search .................................. 714/738, 733, 714/739, 734, 728, 732, 724

(56) References Cited

U.S. PATENT DOCUMENTS 4,594,711 A * 6/1986 Thatte
4,870,346 A * 9/1989 Mydill et al.
5,825,785 A * 10/1998 Barry et al.

FOREIGN PATENT DOCUMENTS

KR 1998-028174 7/1998

OTHER PUBLICATIONS

"Distributed Self–Diagnosis of VLSI Mesh array processors" Cutler et al, 1991 IEEE VLSI test sysmposium, paper.9.4, pp. 178–186.*
Notice to Submit Response, Oct.–1998–0032891, Jun. 26, 2000.

* cited by examiner

Primary Examiner—Phung M. Chung
(74) Attorney, Agent, or Firm—Myers Bigel Sibley & Sajovec, P.A.

(57) ABSTRACT

Integrated circuit devices have a self-test capability in which a sequence of input data patterns are generated by a test pattern unit and are selectively applied to a functional or test block that is selected from a plurality of potential test blocks. The output data patterns that are generated by the selected test block are provided to a data compression unit that generates a signature in response thereto. This signature can then be compared with an expected pattern to determine whether the selected test block is functioning properly. Because the test pattern unit and the data compression unit are shared by a plurality of test blocks, the area normally reserved for test circuitry in an integrated circuit device can be reduced.

27 Claims, 8 Drawing Sheets

INTEGRATED CIRCUIT DEVICES THAT INCLUDE SELF-TEST APPARATUS FOR TESTING A PLURALITY OF FUNCTIONAL BLOCKS AND METHODS OF TESTING SAME

CROSS REFERENCE TO RELATED APPLICATION

This application claims the benefit of Korean Patent Application No. 98-32891, filed Aug. 13, 1998, the disclosure of which is hereby incorporated herein by reference.

FIELD OF THE INVENTION

The present invention relates generally to the field of integrated circuit testing, and, more particularly, to integrated circuit devices having a built-in self-test (BIST) capability.

BACKGROUND OF THE INVENTION

As the integration level of integrated circuit devices increases, traditional methods for device testing and verification may become obsolete. Devices may contain thousands of internal input/output (I/O) lines, but the number of I/O pins provided at the exterior of a device is typically limited by size and space constraints. Accordingly, testing techniques in which test patterns are applied to a device's external inputs and the responses measured on the device's external outputs may not be capable of thoroughly testing for internal defects in the device.

One technique that can be used to directly test the internal structures of a device is known as built-in self-test (BIST). Broadly stated, BIST involves the addition of test apparatus to a component, such as an integrated circuit device, a board, or a system, that can allow the component to test itself. In the case of an integrated circuit device, a goal of BIST is to move much of the test equipment functions into the device under test so that the complexity of the interface between the test equipment and the external I/O pins may be reduced.

Two components that may be used in BIST apparatus are pseudo-random pattern generators (PRPG) and multiple-input signature registers (MISR). Both PRPGs and MISRs typically comprise a linear feedback shift register (LFSR) as their core. The structure and operation of a conventional PRPG and a conventional MISR is described hereafter with reference to FIGS. 1 and 2 respectively.

With reference to FIG. 1, a conventional PRPG 10 comprises an LFSR that includes a plurality of coefficient blocks 11, 12, 13, and 14, EXCLUSIVE-OR gates 15, 16, 17, and 18, and D flip-flops 19, 20, 21, and 22 that are connected as illustrated. As shown in FIG. 1, The D flip-flops 19, 20, 21, and 22 are configured in a serial arrangement such that the output from one flip-flop is connected to the input of another flip-flop through an EXCLUSIVE-OR gate 15, 16, 17, and 18. The output of each D flip-flop 19, 20, 21, and 22 is updated in response to a clock signal CLK. The coefficients 11, 12, 13, and 14 are used to selectively form feedback loops between the output of the last D flip-flop 22 in the series and each EXCLUSIVE-OR gate 15, 16, 17, and 18. When a coefficient is set to one, a feedback path is formed. Conversely, when a coefficient is set to zero, a feedback path is not formed. Thus, the LFSR of FIG. 1 includes a plurality of successive stages with each stage comprising a coefficient block, an EXCLUSIVE-OR gate, and a D flip-flop. During operation, the PRPG 10 generates an n-bit sequence of pseudo-random patterns at the outputs of the D flip-flops 19, 20, 21, and 22. The sequence is pseudo-random in the sense that the probability of a one or a zero is approximately fifty percent, but the sequence is repeatable.

An LFSR as shown in FIG. 1 can also be characterized as a primitive polynomial, P(X), as set forth in Equation 1 below:

$$P(X)=1+C_1 X+C_2 X^2+ \ldots +C_{n-1}X^{n-1}+C_n X^n \qquad \text{EQ. 1}$$

where the coefficient blocks 11, 12, 13, and 14 correspond to the coefficients in the polynomial. The degree of the polynomial corresponds to the number of stages in the LFSR.

Referring now to FIG. 2, it is shown that a conventional MISR 30 may comprise a plurality of EXCLUSIVE-OR gates 31, 32, 33, and 34, D flip-flops 35, 36, 37, and 38, and coefficient blocks 39, 40, 41, and 42, that are connected as illustrated. The composition and operation of the MISR 30 shown in FIG. 2 is substantially the same as the PRPG/LFSR 10 discussed above with reference to FIG. 1. One difference, however, is that the EXCLUSIVE-OR gates 31, 32, 33, and 34 receive output data $D_1, D_2, D_{n-}$ and $D_n$ from, for example, a device under test. The output data $D_1$–$D_n$ are representative of a stream or sequence of output patterns generated by a device under test in response to the pseudo-random patterns generated by the PRPG 10 of FIG. 1. The MISR 30 compresses this entire stream or sequence of output patterns into a single signature value. The signature can then be compared with a desired value to determine whether the device under test is functioning properly. This determination can be made using internal decision circuitry or the signature could be made available outside of the testing apparatus (i.e., the PRPG 10 and the MISR 30) to another component where the test results are evaluated.

During a test session, it may be desirable to test various functional blocks in a device or circuit. In this regard, FIG. 3 shows a conventional test circuit for testing a plurality of functional blocks using a plurality of PRPGs/LFSRs 50, 51, 52, 53 and MISRs 54, 55, 56, 57. In the example shown, block A 58, block B 59, block C 60, and block D 61 denote different functional blocks in an integrated circuit under test. An LFSR-MISR pair is assigned to each block as illustrated. When a test is performed, pseudo-random patterns are generated by the LFSRs 50, 51, 52, and 53 under the supervision of a test control unit 62 and are provided to the functional blocks 58, 59, 60, and 61. In response, each functional block 58, 59, 60, and 61 generates a stream or sequence of output patterns, which are provided to the corresponding MISRs 54, 55, 56, and 57 to be compressed into signatures. The test control unit 62 then compares these signatures with expected values to determine if the functional blocks 58, 59, 60, and 61 are operating properly.

Unfortunately, as the number of functional blocks in an integrated circuit increases, the number of PRPGs/LFSRs and MISRs used to test these blocks generally increases at the same rate. As a result, the area needed on a chip to implement the test circuitry (i.e., PRPGs/LFSRs, MISRs) might become excessive.

SUMMARY OF THE INVENTION

It is therefore an object of the present invention to provide improved integrated circuit devices having a self-test capability.

It is another object of the present invention to allow layout area used for self-test apparatus in an integrated circuit device having a plurality to functional or test blocks to be reduced.

These and other objects, advantages, and features of the present invention may be provided by integrated circuit devices that have a self-test capability and methods of testing same in which a sequence of input data patterns are generated by a test pattern unit and are selectively applied to a functional or test block that is selected from a plurality of potential test blocks. The output data patterns that are generated by the selected test block are provided to a data compression unit that generates a signature in response thereto. This signature can then be compared with an expected pattern to determine whether the selected test block is functioning properly. Because the test pattern unit and the data compression unit are shared by a plurality of test blocks, the area normally reserved for test circuitry in an integrated circuit device can be reduced.

In accordance with an illustrative embodiment of the present invention, both the test pattern unit and the data compression unit are implemented using a single memory and a single polynomial block.

In accordance with another illustrative embodiment of the present invention, the test pattern unit and the data compression unit are implemented using distinct memories and polynomial blocks.

In accordance with still another illustrative embodiment of the present invention, multiple test units and data compression units can be used to facilitate the testing of integrated circuit devices in which the functional or test blocks do not have the same number of input ports. For example, a first test unit can be used to generate a sequence of n-bit data patterns to be applied to a selected first test block. The output data patterns that are generated by the selected first test block are provided to a first data compression unit that generates a first signature in response thereto. Similarly, a second test unit can be used to generate a sequence of m-bit data patterns to be applied to a second test block. The output data patterns that are generated by the selected second test block are provided to a second data compression unit that generates a second signature in response thereto. Thus, the functionality of test blocks having different numbers of input ports can be tested substantially simultaneously.

The built-in self-test apparatus according to the present invention can be implemented in a relatively small area on a chip because the self-test apparatus is shared by a plurality of functional or test blocks. Moreover, the built-in self-test apparatus can be applied to a printed circuit substrate or other large circuit as well as to the chip of a semiconductor integrated circuit.

BRIEF DESCRIPTION OF THE DRAWINGS

Other features of the present invention will be more readily understood from the following detailed description of specific embodiments thereof when read in conjunction with the accompanying drawings, in which.

DETAILED DESCRIPTION OF PREFERRED EMBODIMENTS

Figure 1:
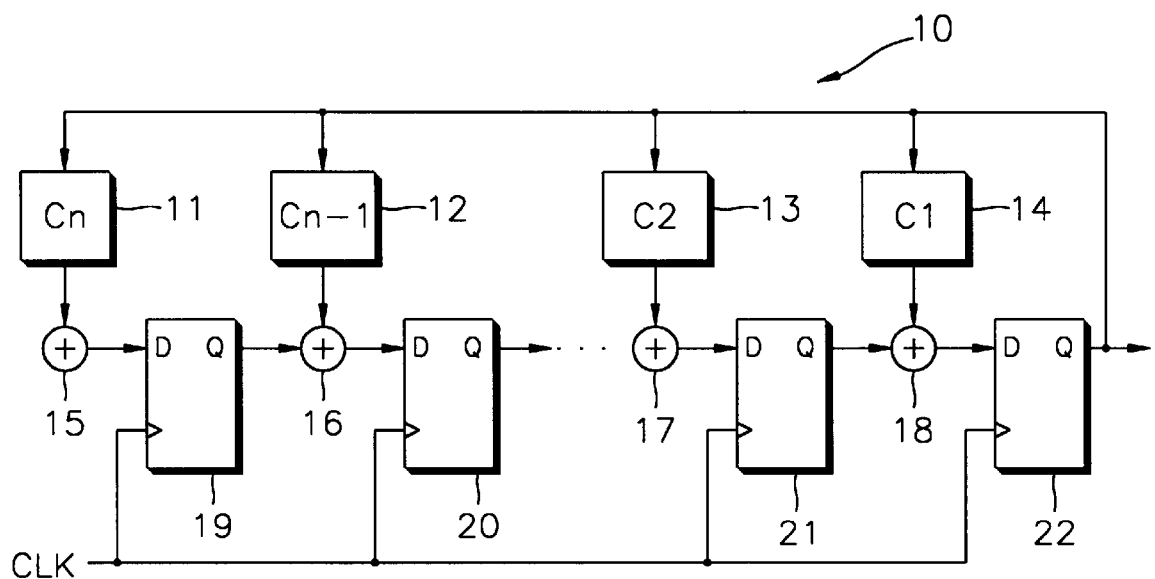
FIG. 1 is a block diagram of a PRPG/LFSR in accordance with the prior art.
Figure 2:
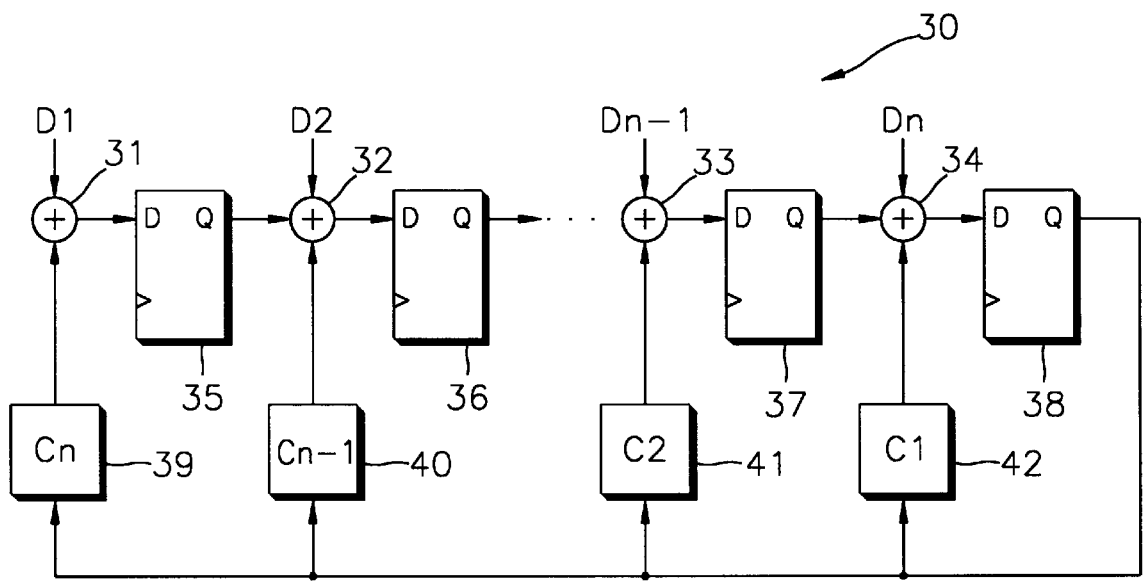
FIG. 2 is a block diagram of a MISR in accordance with the prior art, which is typically used with the PRPG/LFSR of FIG. 1 to test a device or circuit.
Figure 3:
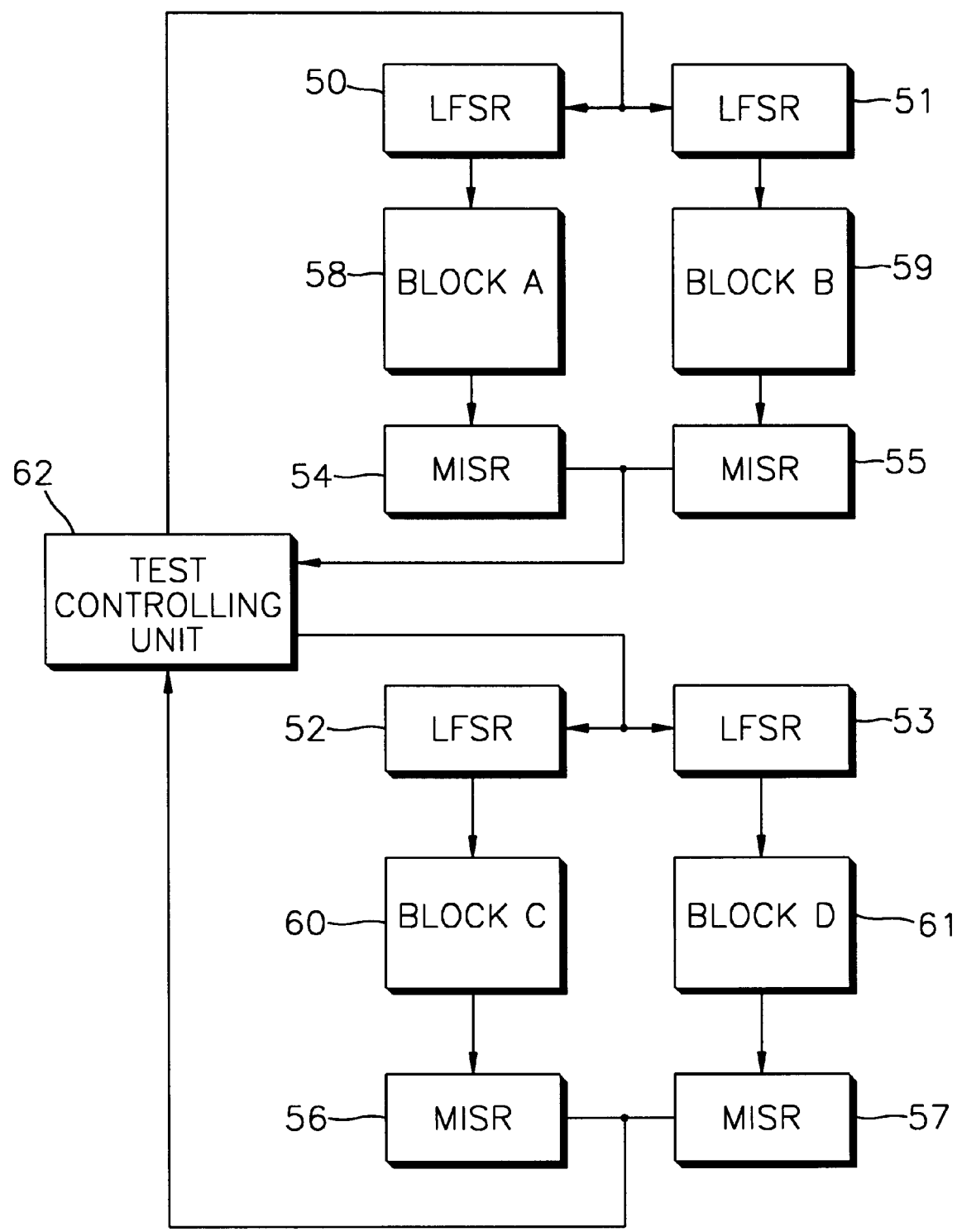
FIG. 3 is a block diagram of a conventional test circuit incorporating multiple PRPGs/LFSRs and MISRs according to FIGS. 1 and 2 and used to test a plurality of functional blocks.

While the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention as defined by the claims. Like reference numbers signify like elements throughout the description of the figures.

Figure 4:
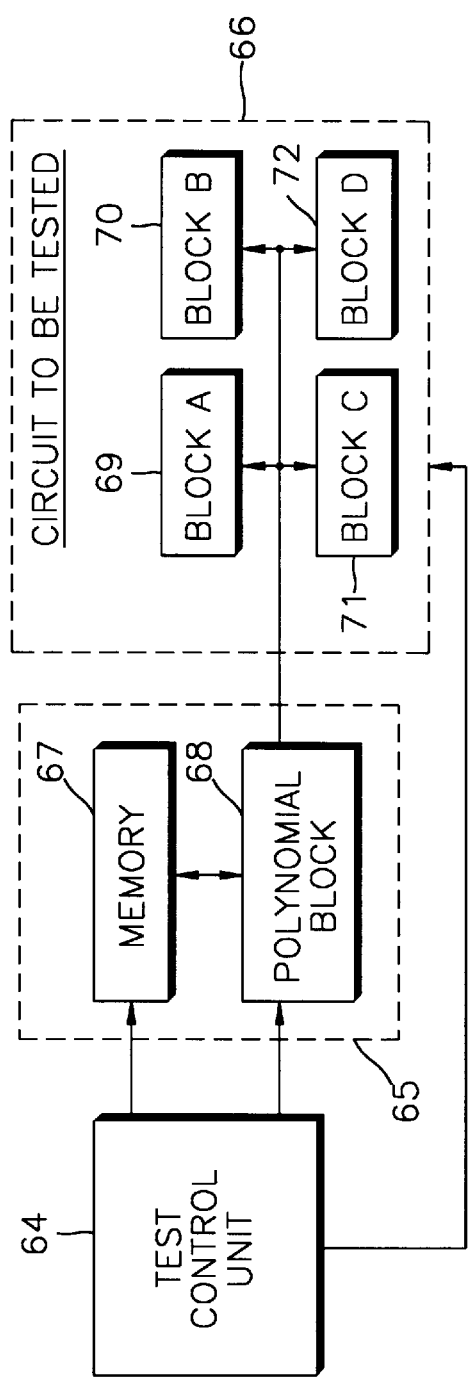
FIG. 4 is a block diagram of a control unit and a test pattern unit that generates a sequence of input data patterns for testing a plurality of functional or test blocks in accordance with an embodiment of the present invention.

With reference to FIG. 4, testing apparatus according to an embodiment of the present invention comprises a test control unit 64, a test pattern unit 65, and a circuit to be tested 66. The test pattern unit 65 comprises a memory 67 and a polynomial block 68. Preferably, an embedded memory of the circuit to be tested 66 is used as the memory 67. The circuit to be tested 66 further comprises four test blocks 69, 70, 71, and 72.

Figure 5:
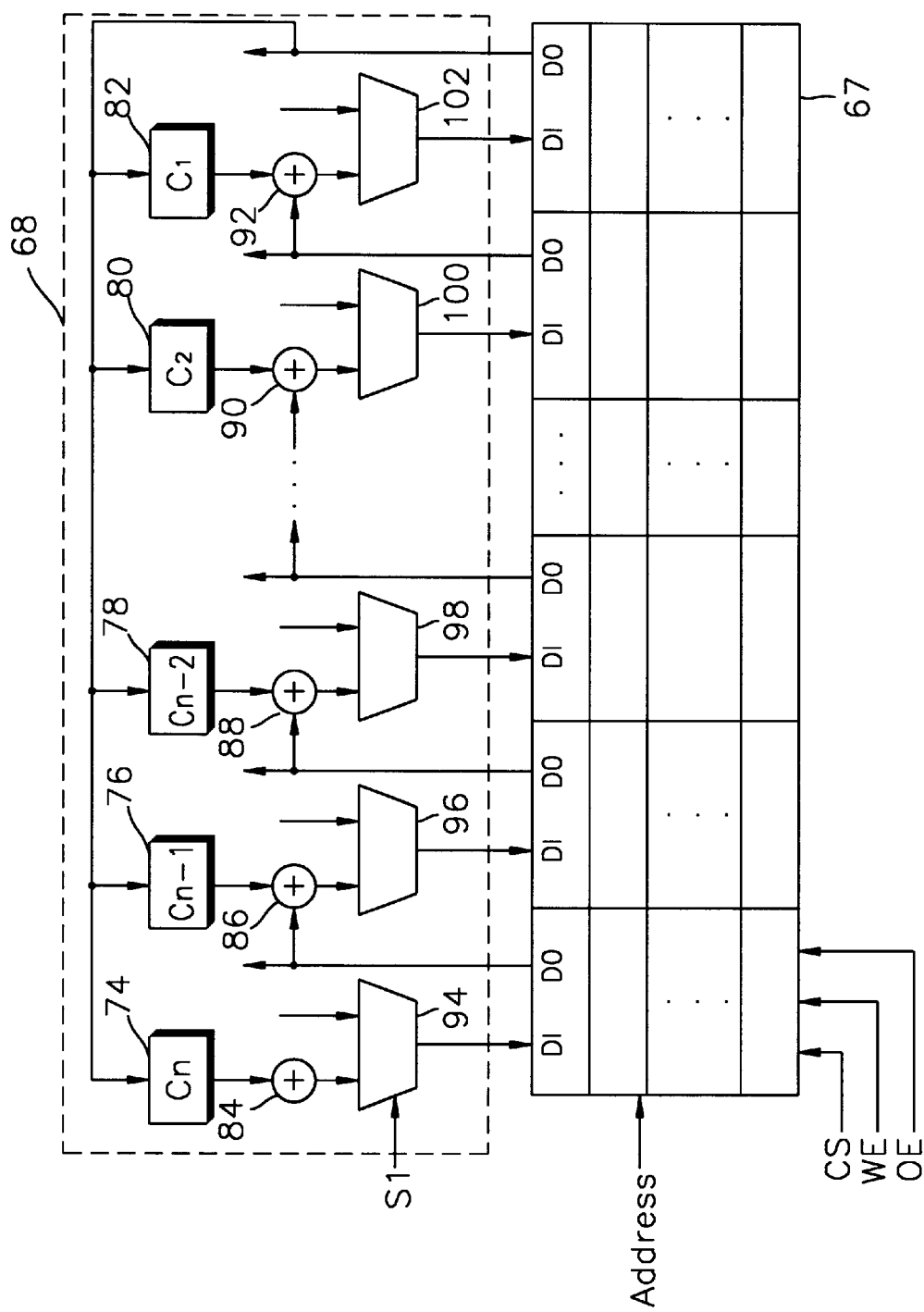
FIG. 5 is a detailed block diagram of the test pattern unit of FIG. 4.

The memory 67 and polynomial block 68 are illustrated in greater detail in FIG. 5. The polynomial block 68 shown in FIG. 5 is described in the commonly assigned U.S. patent application Ser. No. 08/951,189 entitled "Linear Feedback Shift Register, Multiple Input Signature Register and Built-In Self Test Circuit Using Such Registers," filed Oct. 15, 1997, the disclosure of which is hereby incorporated herein by reference.

The memory 67 includes a plurality of cells with each cell corresponding to a flip-flop in a conventional LFSR. More specifically, a memory cell can be accessed by an address signal (Address) and a chip select signal CS to allow the memory cell to receive one bit of data in response to a write enable signal WE. The data is temporarily stored in the memory cell and then output in response to an output enable signal OE. The address signal (Address), chip select signal CS, write enable signal WE, and output enable signal OE are all preferably supplied from the test control unit 64.

The polynomial block 68 comprises a plurality of stages such that each stage includes a coefficient block 74, 76, 78, 80, 82, an EXCLUSIVE-OR gate 84, 86, 88, 90, 92, and a multiplexer 94, 96, 98, 100, 102. The number of stages corresponds to the degree of the primitive polynomial implemented by the polynomial block 68.

The coefficient blocks 74, 76, 78, 80, and 82 represent coefficients of the primitive polynomial. When a coefficient is set to one, a feedback path is formed. Conversely, when a coefficient is set to zero, a feedback path is not formed. Thus, the EXCLUSIVE-OR gate 84 outputs the signal fed back through the coefficient block 74 to an input terminal of the multiplexer 94. Similarly, the EXCLUSIVE-OR gates 86, 88, 90, and 92 perform EXCLUSIVE-OR operations on the signals fed back through the coefficient blocks 76, 78, 80, and 82 and the output of the memory 67 cell associated with a previous stage.

Each of the multiplexers 94, 96, 98, 100, and 102 includes two input terminals such that an output signal from an associated EXCLUSIVE-OR gate 84, 86, 88, 90, and 92 is received at one input terminal and the other input terminal is preferably connected to a general data bus of a built-in memory. When a select control signal S1 exhibits a logical one, the multiplexers 94, 96, 98, 100, and 102 select the output signals of the EXCLUSIVE-OR gates 85, 86, 88, 90, and 92 and supply them to the memory 67. Under this condition, the memory 67 operates in a built-in self-test mode and constructs a part of a shift chain. When the select control signal S1 exhibits a logical zero, the multiplexers 94, 96, 98, 100, and 102 connect a general data bus of an embedded memory to the memory 67 thereby allowing the memory 67 to be used in a conventional manner (e.g., data storage).

The operation of the testing apparatus of FIG. 4 is described hereinafter with reference to FIGS. 4 and 5. When a built-in self-test is performed, the test control unit 64 initializes the data pattern stored in the memory 67 by driving the select control signal S1 to a logical zero, which is then applied to the multiplexers 94, 96, 98, 100, and 102. Namely, an initial value of the data pattern is written in a selected address space by applying an address to the memory 67 and supplying predetermined patterns to the second input terminals of the multiplexers 94, 96, 98, 100, and 102.

A built-in self-test is initiated when the test control unit 64 drives the select control signal S1 to a logical one, which is then applied to the multiplexers 94, 96, 98, 100, and 102. The EXCLUSIVE-OR gates 86, 88, 90, and 92 perform EXCLUSIVE-OR operations on the fed back signals and the output of a memory 67 cell associated with a previous stage. When the system clock signal and the write enable signal WE are applied, the outputs of the EXCLUSIVE-OR gates 84, 86, 88, 90, and 92 are written into the memory 67 through the multiplexers 94, 96, 98, 100, and 102. During a subsequent clock cycle, the output enable signal OE is applied and the respective cells of the memory 67 output the written data. Through repetition of the aforementioned shift operation, a pseudo-random test pattern, characterized according to the number of shifts, is stored in the memory 67. In the present embodiment, the same test pattern is simultaneously supplied to the test blocks 69, 70, 71, and 72 in the tested circuit 66.

According to an alternative embodiment of the present invention, however, different test patterns may be sequentially supplied to the respective blocks 69, 70, 71, and 72. It is understood that the present embodiment can be modified so that a multiplexer is arranged between the polynomial block 68 and the respective test blocks 69, 70, 71, and 72 in the tested circuit 66. In this configuration, test patterns corresponding to the respective test blocks 69, 70, 71, and 72 can be generated using the memory 67 and the polynomial block 68, and the generated test patterns can be selectively supplied to the test blocks 69, 70, 71, and 72 on an individual basis. In accordance with still another alternative embodiment of the present invention, separate address space in the memory 67 can be used to form test patterns corresponding to the respective test blocks 69, 70, 71, and 72 in the tested circuit 66.

Advantageously, the test pattern unit 65 of FIG. 4 can reduce the area normally reserved for test circuitry in an integrated circuit device because the test pattern unit 65 is shared by a plurality of test blocks and the embedded memory of the integrated circuit device is used.

After applying the test patterns generated by the test pattern unit 65 to the blocks 69, 70, 71, and 72, the output signals from the blocks 69, 70, 71, and 72 can be evaluated to determine if the blocks 69, 70, 71, and 72 are functioning properly.

Figure 6:
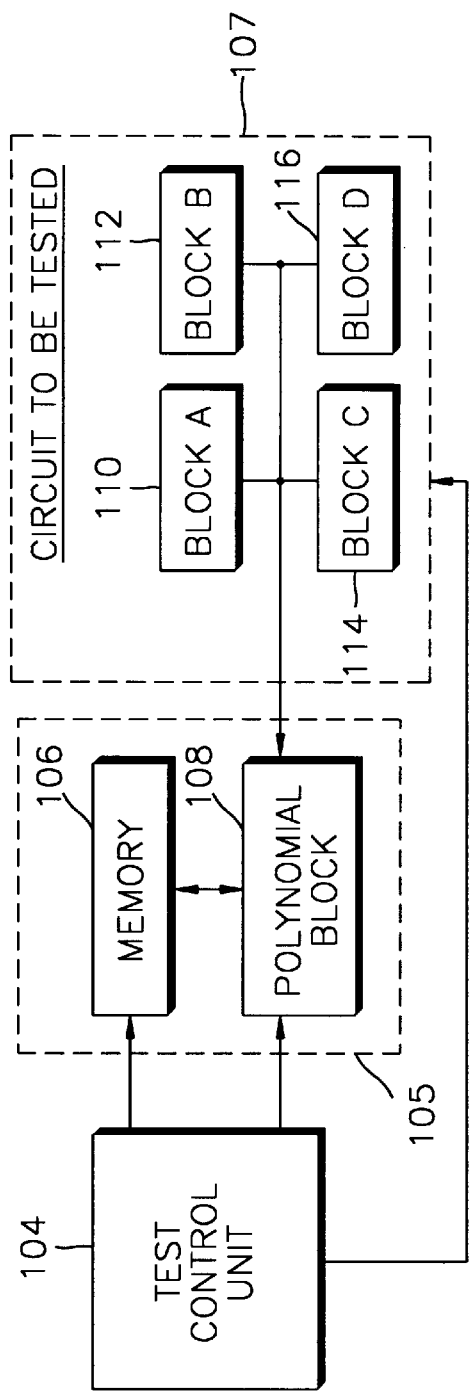
FIG. 6 is a block diagram of a control unit and a data compression unit that compresses a sequence of output patterns from a functional or test block into a signature in accordance with an embodiment of the present invention.

With reference to FIG. 6, testing apparatus that provides signal or data compression according to an embodiment of the present invention comprises a test control unit 104, a data compression unit 105, and a circuit to be tested 107. The data compression unit 105 comprises a memory 106 and a polynomial block 108. Preferably, an embedded memory of the circuit to be tested 107 is used as the memory 106. The circuit to be tested 107 further comprises four test blocks 110, 112, 114, and 116.

Figure 7:
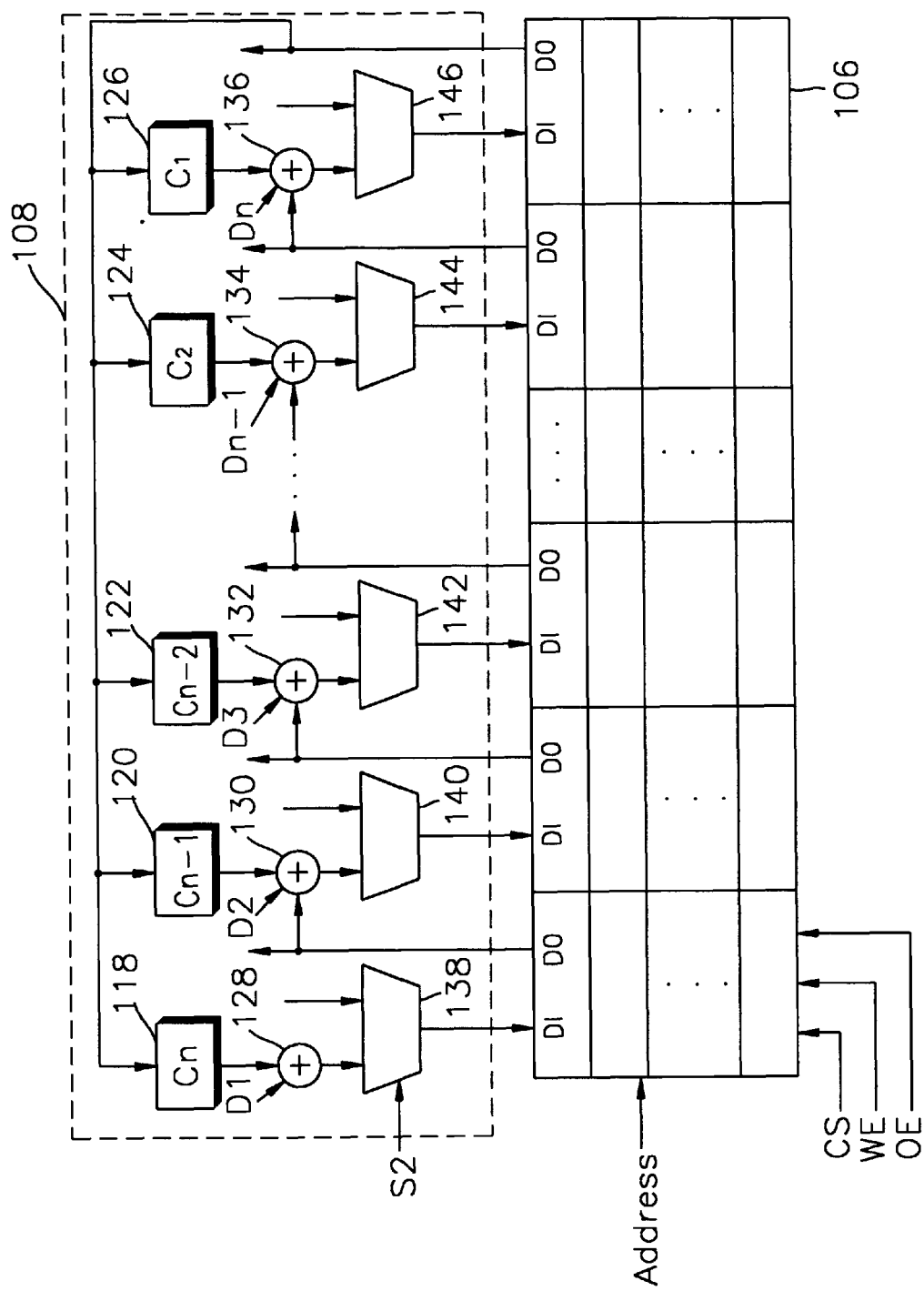
FIG. 7 is a detailed block diagram of the data compression unit of FIG. 6.

FIG. 7 shows the memory 106 and the polynomial block 108 of FIG. 6 in more detail. The memory 106 includes a plurality of cells with each cell corresponding to a flip-flop in a conventional MISR. More specifically, a memory cell can be accessed by an address signal (Address) and a chip select signal CS to allow the memory cell to receive one bit of data in response to a write enable signal WE. The data is temporarily stored in the memory cell and then output in response to an output enable signal OE. The address signal (Address), chip select signal CS, write enable signal WE, and output enable signal OE are all supplied from the test control unit 104.

The polynomial block 108 comprises a plurality of stages such that each stage includes a coefficient block 118, 120, 122, 124, 126, an EXCLUSIVE-OR gate 128, 130, 132, 134, 136, and a multiplexer 138, 140, 142, 144, 146. The number of stages corresponds to the degree of the primitive polynomial implemented by the polynomial block 108.

The polynomial block 108 of FIG. 7 is similar to the polynomial block 68 of FIG. 5, with the exception that the EXCLUSIVE-OR gates 128, 130, 132, 134, and 136 receive signals $D_1$ through $D_n$ from the outputs of the test blocks 110, 112, 114, and 116. Therefore, only the EXCLUSIVE-OR gates 128, 130, 132, 134, and 136 will be described.

The EXCLUSIVE-OR gate 128 performs EXCLUSIVE-OR operations with respect to the signal fed back through the coefficient block 118 and the signal D1 output from the test blocks 110, 112, 114, and 116. Similarly, the EXCLUSIVE-OR gates 130, 132, 134, and 136 perform EXCLUSIVE-OR operations on the signals fed back through the coefficient blocks 120, 122, 124, and 126, the output of the memory 106 cell associated with a previous stage, and the signal (one among $D_2$ through $D_n$) output from the test blocks 110, 112, 114 and 116.

The operation of the testing apparatus of FIG. 6 is described hereinafter with reference to FIGS. 6 and 7. When signal or data compression is initiated, the test control unit 104 drives the select control signal S2 to a logical one, which is then applied to the multiplexers 138, 140, 142, 144, and 146. In addition, one of the test blocks 110, 112, 114, and 116 in the tested circuit 107 is selected by using a switch (not shown), which is controlled by the test control unit 104. The output signals from the selected test block are supplied to the EXCLUSIVE-OR gates 128, 130, 132, 134, and 136.

The EXCLUSIVE-OR gates 128, 130, 132, 134, and 136 perform EXCLUSIVE-OR operations on the signals $D_1$ through $D_n$, which are output from the selected test block 110, 112, 114, or 116, the signals fed back through the coefficient blocks 118, 120, 122, 124, and 126, and the output of the memory 106 cell associated with a previous stage (EXCLUSIVE-OR gates 130, 132, 134, and 136 only). When the system clock signal and the write enable signal WE are applied, the outputs of the EXCLUSIVE-OR gates 128, 130, 132, 134, and 136 are written into the memory 106 through the multiplexers 138, 140, 142, 144, and 146. During a subsequent clock cycle, the output enable signal OE is applied and the respective cells of the memory 106 output the written data. Through repetition of the foregoing operations, the signals that are output from the selected one of the test blocks 110, 112, 114, and 116 can be compressed. Note that the results of compressing the output signals from the respective test blocks 110, 112, 114, and 116 can be stored in separate address space in the memory 106.

After compressing the signals or data from a selected test block 110, 112, 114, or 116, the compressed data is compared with an estimated pattern by the test control unit 104 or, alternatively, a normal state determining unit (not shown). Accordingly, a determination can be made whether the selected test block 110, 112, 114, or 116 is functioning properly. In accordance with an alternative embodiment of the present invention, the compressed data can be provided outside of the integrated circuit device for processing (e.g., comparison with an expected pattern) and evaluation to determine whether a particular test block is functioning properly.

Advantageously, the data compression unit 105 of FIG. 6 can reduce the area normally reserved for test circuitry in an integrated circuit device because the data compression unit 105 is shared by a plurality of test blocks and the embedded memory of the integrated circuit device is used.

Figure 8:
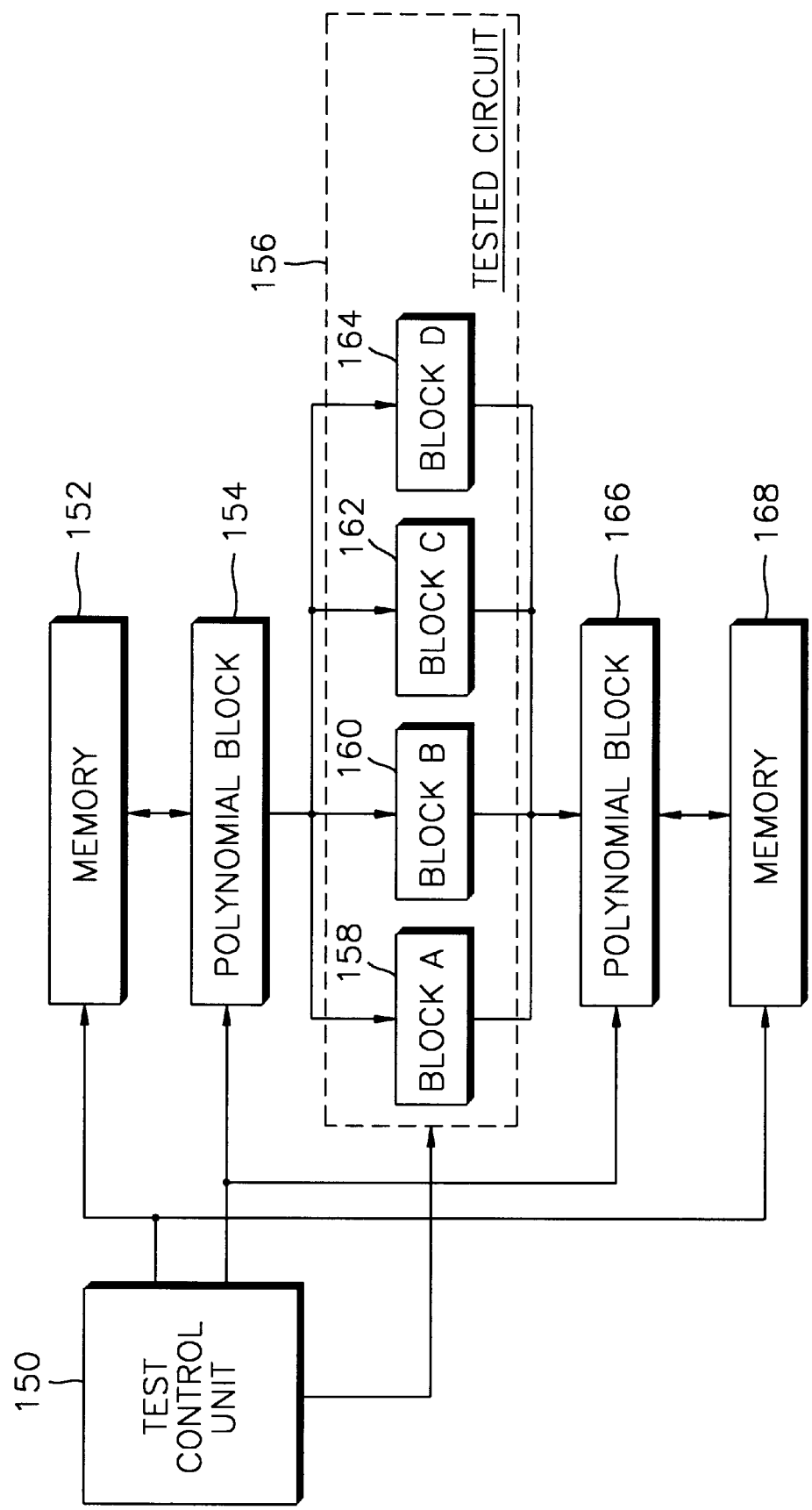
FIGS. 8–10 are block diagrams of built-in self-test apparatus for testing a plurality of functional or test blocks in an integrated circuit using the test pattern unit and the data compression unit of FIGS. 4 and 6 according to alternative embodiments of the present invention.

FIG. 8 shows a built-in self-test apparatus for testing a plurality of test blocks according to an embodiment the present invention. The built-in self-test apparatus of FIG. 8 is preferably constructed by combining the test pattern generating apparatus of FIG. 4 with the data compression apparatus of FIG. 6 to test a circuit comprising a plurality of test blocks.

A memory 152 and a polynomial block 154 are used to generate pseudo-random test patterns, which are provided to test blocks 158, 160, 162, and 164 in a circuit 156. According to the present embodiment, the test patterns are sequentially provided to the respective test blocks 158, 160, 162, and 164. The data output by a test block 158, 160, 162, or 164 in response to a received test pattern is provided to a polynomial block 166. The polynomial block 166 and the memory 168 compress the output data from a particular test block 158, 160, 162, or 164 as discussed hereinbefore with respect to FIGS. 6 and 7. In FIG. 8, the memory 152 for generating the test pattern and the memory 168 for compressing the output data from the test blocks 158, 160, 162, and 164 are separately shown. Nevertheless, according to an alternative embodiment of the present invention, the memories can be one physical memory.

Figure 9:
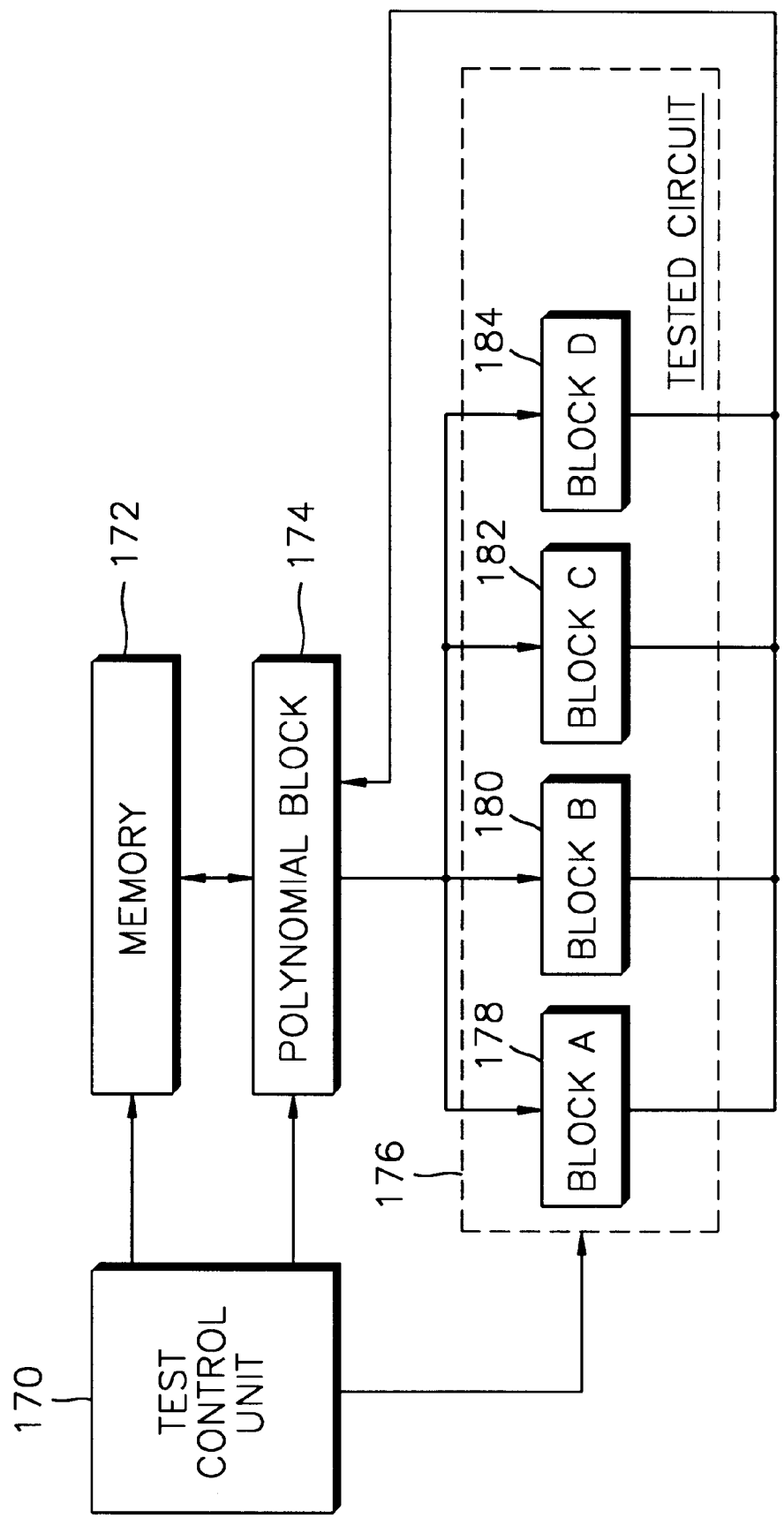

FIG. 9 shows a built-in self-test apparatus for testing a plurality of test blocks according to another embodiment of the present invention. The built-in self test apparatus of FIG. 9 is preferably constructed by combining the test pattern generating apparatus of FIG. 4 with the data compression apparatus of FIG. 6 to test a circuit comprising a plurality of test blocks. The built-in self test apparatus of FIG. 9, however, uses a single memory and polynomial block to generate the test patterns and to compress output data from the test blocks.

In particular, a memory 172 and a polynomial block 174 generate pseudo-random test patterns, which are provided to a selected test block 178, 180, 182, or 184 in a tested circuit 176. The data output by the selected test block 178, 180, 182, or 184 in response to a received test pattern is provided to the polynomial block 174. The polynomial block 174 and the memory 172 compress the output data from a particular test block 178, 180, 182, or 184 as discussed hereinbefore with respect to FIGS. 6 and 7.

Figure 10:
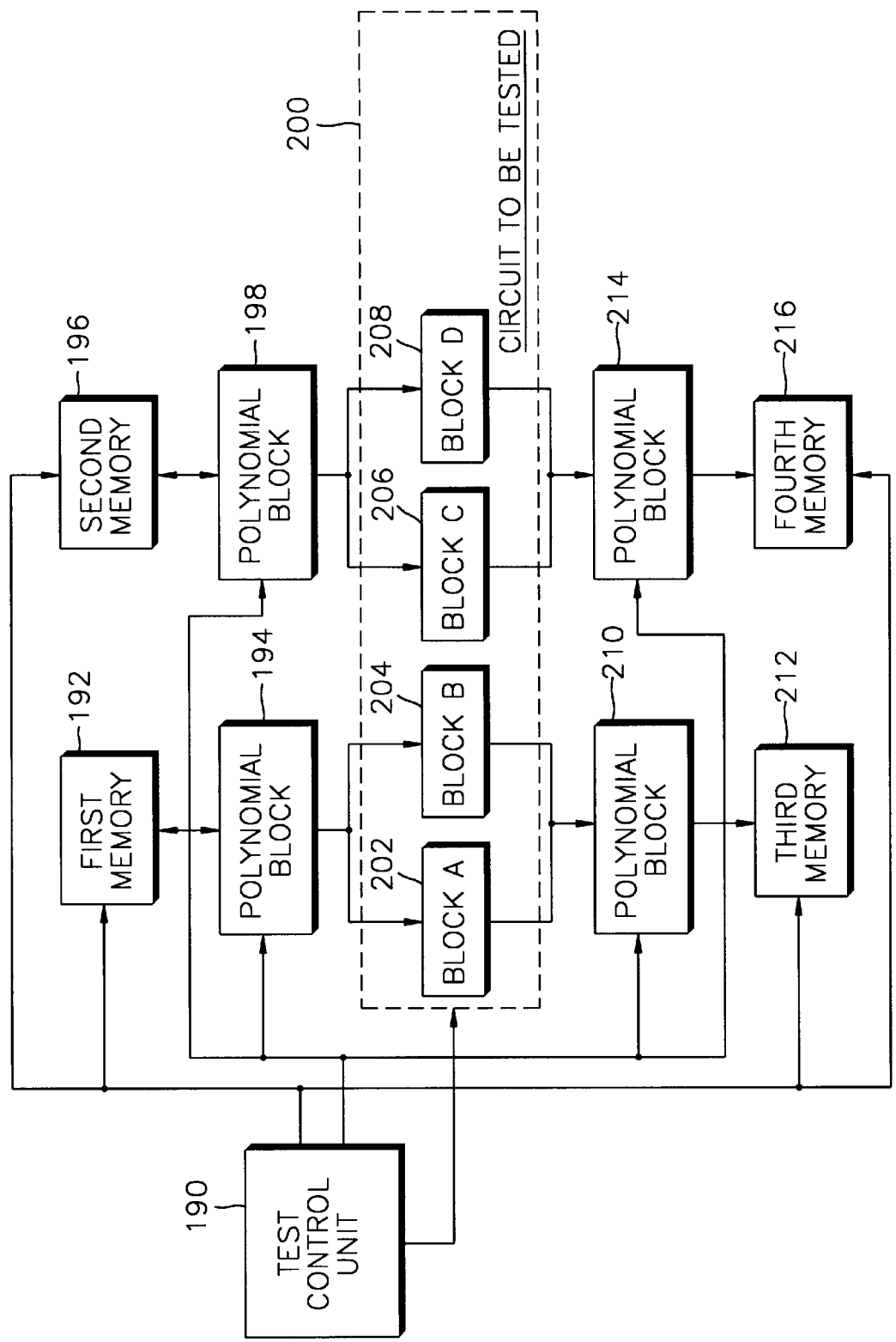

When the number of the input ports of the respective functional test blocks in the tested circuit varies, polynomial blocks having different numbers of stages are preferably used to test the respective test blocks. FIG. 10 shows a built-in self-test apparatus for testing a plurality of test blocks according to still another embodiment of the present invention. As shown in FIG.10, a circuit to be tested 200 includes four functional or test blocks 202, 204, 206, and 208. For purposes of illustration, assume that the number of input ports associated with the test blocks 202 and 204 is different from the number of input ports associated with the test blocks 206 and 208.

A first memory 192 and a polynomial block 194 are used to generate pseudo-random test patterns, which are sequentially provided to the test blocks 202 and 204. The length of the pseudo-random test pattern generated by the first memory 192 and the polynomial block 194 preferably depends on the number of input ports of the test blocks 202 and 204. The data output by test block 202 and test block 204 in response to a received test pattern is provided to a polynomial block 210. The polynomial block 210 and a third memory 212 compress the output data from the particular test block 202 or 204 as discussed hereinbefore with respect to FIGS. 6 and 7. In FIG. 10, the first memory 192 for generating the test pattern and the third memory 212 for compressing the data are separately shown. Nevertheless, according to an alternative embodiment of the present invention, the memories can be one physical memory.

A second memory 196 and a polynomial block 198 are used to generate pseudo-random test patterns, which are sequentially provided to the test blocks 206 and 208. The length of the pseudo-random pattern generated by the second memory 196 and the polynomial block 198 preferably depends on the number of input ports of the test blocks 206 and 208. The data output by test block 202 and test block 204 in response to a received test pattern is provided to a polynomial block 214. The polynomial block 214 and a fourth memory 216 compress the output data from the particular test block 206 or 208 as discussed hereinbefore with respect to FIGS. 6 and 7. In FIG. 10, the second memory 196 for generating the test pattern and the fourth memory 216 for compressing the data are separately shown. Nevertheless, according to an alternative embodiment of the present invention, the memories can be one physical memory. Moreover, according to yet another alternative embodiment of the present invention, the first through fourth memories 192, 196, 212, and 216 can be one physical memory.

In concluding the detailed description, it should be noted that many variations and modifications can be made to the preferred embodiment without substantially departing from the principles of the present invention. All such variations and modifications are intended to be included herein within the scope of the present invention, as set forth in the following claims.

I claim:

1. An integrated circuit device, comprising:

a test pattern unit that generates a sequence of input data patterns;

a plurality of test blocks that are connected in parallel to the test pattern unit;

a control unit that selects a test block from the plurality of test blocks, the selected test block being responsive to the input data patterns to generate a sequence of output data patterns; and a data compression unit responsive to the sequence of output data patterns that generates a signature.

2. The integrated circuit device as recited in claim 1, wherein the test pattern unit and data compression unit comprise:

a memory; and a polynomial block that accesses the memory to generate the sequence of input data patterns and signature.

3. The integrated circuit device as recited in claim 2, wherein the polynomial block comprises:

a first plurality of multiplexers; and a first plurality of EXCLUSIVE-OR gates that are responsive to the memory and an output of one of the first plurality of multiplexers, which is selectively coupled to each of the first plurality of EXCLUSIVE-OR gates via a coefficient.

4. The integrated circuit device as recited in claim 3, wherein the polynomial block further comprises:

a second plurality of multiplexers; and a second plurality of EXCLUSIVE-OR gates that are responsive to the memory, the sequence of output data patterns, and an output of one of the second plurality of multiplexers, which is selectively coupled to each of the second plurality of EXCLUSIVE-OR gates by a coefficient.

5. The integrated circuit device as recited in claim 1, wherein the test pattern unit comprises:

a first memory; and a first polynomial block that accesses the first memory to generate the sequence of input data patterns.

6. The integrated circuit device as recited in claim 5, wherein the first polynomial block comprises:

a first plurality of multiplexers; and a first plurality of EXCLUSIVE-OR gates that are responsive to the first memory and an output of one of the first plurality of multiplexers, which is selectively coupled to each of the first plurality of EXCLUSIVE-OR gates via a coefficient.

7. The integrated circuit device as recited in claim 6, wherein the data compression unit comprises:

a second memory; and a second polynomial block that accesses the second memory to generate the signature.

8. The integrated circuit device as recited in claim 7, wherein the second polynomial block comprises:

a second plurality of multiplexers; and a second plurality of EXCLUSIVE-OR gates that are responsive to the second memory, the sequence of output data patterns, and an output of one of the second plurality of multiplexers, which is selectively coupled to each of the second plurality of EXCLUSIVE-OR gates by a coefficient.

9. An integrated circuit device, comprising:

a first test pattern unit that produces a sequence of n-bit input data patterns;

a second test pattern unit that produces a sequence of m-bit input data patterns;

a first plurality of test blocks that are connected in parallel to the first test pattern unit;

a second plurality of test blocks that are connected in parallel to the second test pattern unit;

a control unit that selects a first test block from the first plurality of test blocks, the first test block being responsive to the sequence of n-bit input data patterns to generate a first sequence of output data patterns, and selects a second test block from the second plurality of test blocks, the second test block being responsive to the sequence of m-bit input data patterns to generate a second sequence of output data patterns;

a first data compression unit responsive to the first sequence of output data patterns that generates a first signature; and a second data compression unit responsive to the second sequence of output data patterns that generates a second signature.

10. The integrated circuit device as recited in claim 9, wherein n and m are different integers.

11. The integrated circuit device as recited in claim 9, wherein the first test pattern unit and the first data compression unit comprise:

a memory; and a polynomial block that accesses the memory to generate the sequence of n-bit input data patterns and the first signature.

12. The integrated circuit device as recited in claim 11, wherein the polynomial block comprises:

a first plurality of multiplexers; and a first plurality of EXCLUSIVE-OR gates that are responsive to the memory and an output of one of the first plurality of multiplexers, which is selectively coupled to each of the first plurality of EXCLUSIVE-OR gates via a coefficient.

13. The integrated circuit device as recited in claim 12, wherein the polynomial block further comprises:

a second plurality of multiplexers; and a second plurality of EXCLUSIVE-OR gates that are responsive to the memory, the first sequence of output data patterns, and an output of one of the second plurality of multiplexers, which is selectively coupled to each of the second plurality of EXCLUSIVE-OR gates by a coefficient.

14. The integrated circuit device as recited in claim 9, wherein the first test pattern unit comprises:

a first memory; and a first polynomial block that accesses the first memory to generate the sequence of n-bit input data patterns.

15. The integrated circuit device as recited in claim 14, wherein the first polynomial block comprises:

a first plurality of multiplexers; and a first plurality of EXCLUSIVE-OR gates that are responsive to the first memory and an output of one of the first plurality of multiplexers, which is selectively coupled to each of the first plurality of EXCLUSIVE-OR gates via a coefficient.

16. The integrated circuit device as recited in claim 15, wherein the first data compression unit comprises:

a second memory; and a second polynomial block that accesses the second memory to generate the first signature.

17. The integrated circuit device as recited in claim 16, wherein the second polynomial block comprises:

a second plurality of multiplexers; and a second plurality of EXCLUSIVE-OR gates that are responsive to the second memory, the first sequence of output data patterns, and an output of one of the second plurality of multiplexers, which is selectively coupled to each of the second plurality of EXCLUSIVE-OR gates by a coefficient.

18. The integrated circuit device as recited in claim 9, wherein the second test pattern unit and the second data compression unit comprise:

a memory; and a polynomial block that accesses the first memory to generate the sequence of m-bit input data patterns and the second signature.

19. The integrated circuit device as recited in claim 18, wherein the polynomial block comprises:

a first plurality of multiplexers; and a first plurality of EXCLUSIVE-OR gates that are responsive to the memory and an output of one of the first plurality of multiplexers, which is selectively coupled to each of the first plurality of EXCLUSIVE-OR gates via a coefficient.

20. The integrated circuit device as recited in claim 19, wherein the polynomial block further comprises:

a second plurality of multiplexers; and a second plurality of EXCLUSIVE-OR gates that are responsive to the memory, the second sequence of output data patterns, and an output of one of the second plurality of multiplexers, which is selectively coupled to each of the second plurality of EXCLUSIVE-OR gates by a coefficient.

21. The integrated circuit device as recited in claim 9, wherein the second test pattern unit comprises:

a first memory; and a first polynomial block that accesses the first memory to generate the sequence of m-bit input data patterns.

22. The integrated circuit device as recited in claim 21, wherein the first polynomial block comprises:

a first plurality of multiplexers; and a first plurality of EXCLUSIVE-OR gates that are responsive to the first memory and an output of one of the first plurality of multiplexers, which is selectively coupled to each of the first plurality of EXCLUSIVE-OR gates via a coefficient.

23. The integrated circuit device as recited in claim 22, wherein the second data compression unit comprises:

a second memory; and a second polynomial block that accesses the second memory to generate the second signature.

24. The integrated circuit device as recited in claim 23, wherein the second polynomial block comprises:

a second plurality of multiplexers; and a second plurality of EXCLUSIVE-OR gates that are responsive to the second memory, the second sequence of output data patterns, and an output of one of the second plurality of multiplexers, which is selectively coupled to each of the second plurality of EXCLUSIVE-OR gates by a coefficient.

25. A method of testing an integrated circuit device having a plurality of test blocks, comprising the steps of:

generating a sequence of input data patterns;

providing the sequence of input data patterns to the plurality of test blocks in parallel;

selecting a test block from the plurality of test blocks; and compressing a sequence of output data patterns, which are produced by the selected test block in response to the sequence of input data patterns, into a signature.

26. A method of testing an integrated circuit device having a first plurality of test blocks having n input terminals and a second plurality of test blocks having m input terminals, comprising the steps of:

generating a sequence of n-bit input data patterns;

providing the sequence of n-bit input data patterns to the first plurality of test blocks in parallel;

selecting a first test block from the first plurality of test blocks;

compressing a first sequence of output data patterns, which are produced by the first test block in response to the sequence of n-bit input data patterns, into a signature;

generating a sequence of m-bit input data patterns;

providing the sequence of m-bit input data patterns to the second plurality of test blocks in parallel;

selecting a second test block from the second plurality of test blocks; and compressing a second sequence of output data patterns, which are produced by the second test block in response to the sequence of m-bit input data patterns, into a signature.

27. The method as recited in claim 26, wherein n and m are different integers.

* * * * *